(12) United States Patent  (10) Patent No.: US 7,648,778 B2
Igarashi et al.  (45) Date of Patent: Jan. 19, 2010

(54) ORGANIC ELECTROLUMINESCENT ELEMENT

(75) Inventors: Tatsuya Igarashi, Kanagawa (JP); Takeshi Murakami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 345 days.

(21) Appl. No.: 11/503,999

(22) Filed: Aug. 15, 2006

(65) Prior Publication Data

US 2007/0040168 A1  Feb. 22, 2007

(30) Foreign Application Priority Data

Aug. 15, 2005  (JP) ............................ P2005-235307

(51) Int. Cl.
*H01L 51/54*  (2006.01)
(52) U.S. Cl. ................. 428/690; 428/917; 313/504; 257/E51.044; 546/4; 548/103
(58) Field of Classification Search ................. None
See application file for complete search history.

(56) References Cited

U.S. PATENT DOCUMENTS

2002/0034656 A1  3/2002  Thompson et al.
2006/0073360 A1*  4/2006  Ise et al. ...................... 428/690

FOREIGN PATENT DOCUMENTS

JP  2003-272861  *  9/2003
JP  2004-221065 A  8/2004

OTHER PUBLICATIONS

Machine translation of JP 2003-272861 (Sep. 2003).*

* cited by examiner

*Primary Examiner*—Marie R. Yamnitzky
(74) *Attorney, Agent, or Firm*—Sughrue Mion, PLLC

(57) ABSTRACT

An organic electroluminescent element comprises: a pair of electrodes; and at least one organic compound layer between the pair of electrodes, said at least one organic compound layer comprising a light-emitting layer, wherein the organic luminescent element comprises at least one complex represented by formula (1):

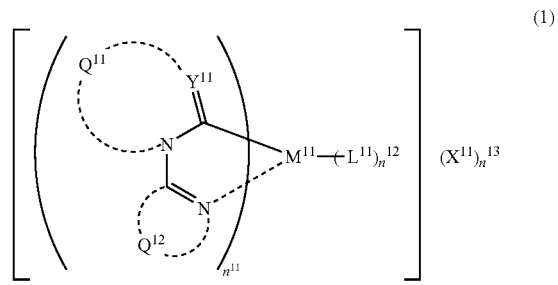

wherein $M^{11}$ represents a hexacoordinate transition metal ion, $Y^{11}$ represents a nitrogen atom or a substituted or unsubstituted carbon atom, $L^{11}$ represents a ligand, $Q^{11}$ and $Q^{12}$ each represents an atomic group for forming a nitrogen-containing heterocyclic ring, $n^{11}$ represents an integer of 1 to 3, $n^{12}$ represents an integer of 0 to 4, $X^{11}$ represents a counter ion, and $n^{13}$ represents an integer of 0 to 3.

7 Claims, No Drawings

ORGANIC ELECTROLUMINESCENT ELEMENT

BACKGROUND OF THE INVENTION

1. Field of the Invention

The present invention relates to an organic electroluminescent element (sometimes called a light-emitting element or an EL element) capable of emitting light by converting electric energy into light.

2. Description of the Related Art

An organic electroluminescent (EL) element is attracting attention as a promising display element because high-brightness light can be emitted with a low voltage. An important characteristic value of this organic electroluminescent element is an external quantum efficiency. The external quantum efficiency is calculated according to:

external quantum efficiency φ=number of photons released from element/number of electrons injected into element As this value is larger, the element is more advantageous in view of electric power consumption.

The external quantum efficiency of the organic electroluminescent element is determined according to:

external quantum efficiency φ=internal quantum efficiency×light take-out efficiency In the organic EL element utilizing fluorescence from an organic compound, the limit value of internal quantum efficiency is 25%, the light take-out efficiency is about 20% and therefore, the limit value of external quantum efficiency is considered to be about 5%.

As the means for more elevating the properties of a light-emitting element, a green light-emitting element utilizing light emission from an ortho-metalated iridium complex (Ir(ppy)$_3$: tris-ortho-metalated complex of iridium(III) with 2-phenylpyridine) has been reported (see, for example, U.S. Patent Application Publication No. 2002/0034656). The phosphorescent element described therein is greatly enhanced in the emission efficiency of green and red lights as compared with the related-art singlet-based light-emitting elements, but improvements are demanded in view of durability.

Also, a light-emitting element using a metal complex for the host material has been proposed (see, for example, JP-A-2004-221065) as means for improving the driving durability, but more improvements are demanded in view of efficiency and durability.

SUMMARY OF THE INVENTION

An object of the present invention is to provide a light-emitting element assured of good light emission efficiency.

This object can be attained by the following means.

(1) An organic electroluminescent element comprising: a pair of electrodes; and at least one organic compound layer between the pair of electrodes, said at least one organic compound layer comprising a light-emitting layer, wherein the organic luminescent element comprises at least one complex represented by formula (1):

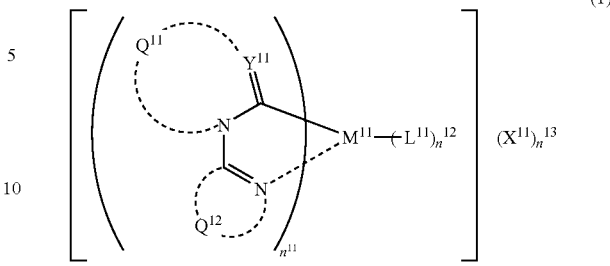

wherein $M^{11}$ represents a hexacoordinate transition metal ion, $Y^{11}$ represents a nitrogen atom or a substituted or unsubstituted carbon atom, $L^{11}$ represents a ligand, $Q^{11}$ and $Q^{12}$ each represents an atomic group for forming a nitrogen-containing heterocyclic ring, $n^{11}$ represents an integer of 1 to 3, $n^{12}$ represents an integer of 0 to 4, $X^{11}$ represents a counter ion, and $n^{13}$ represents an integer of 0 to 3.

(2) The organic electroluminescent element as described in (1), wherein the complex represented by formula (1) is used as a host material.

(3) The organic electroluminescent element as described in (1), wherein the complex represented by formula (1) is used as a light-emitting material.

(4) The organic electroluminescent element as described in any one of (1) to (3), wherein the complex represented by formula (1) is a complex represented by formula (2):

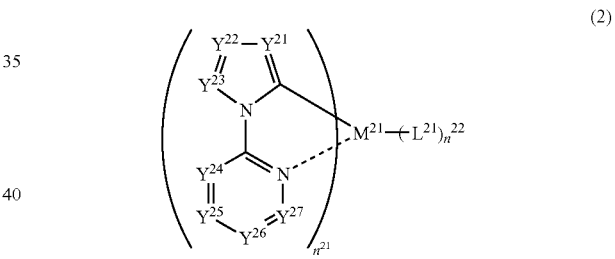

wherein $M^{21}$ represents a hexacoordinate transition metal ion, $Y^{21}$ to $Y^{27}$ each represents a nitrogen atom or a substituted or unsubstituted carbon atom, $L^{21}$ represents a ligand, $n^{21}$ represents an integer of 1 to 3, and $n^{22}$ represents an integer of 0 to 4.

(5) The organic electroluminescent element as described in any one of (1) to (4), wherein the hexacoordinate transition metal ion is a trivalent iridium ion, a trivalent rhodium ion or a monovalent rhenium ion.

DETAILED DESCRIPTION OF THE INVENTION

The present invention relates to an organic electroluminescent element comprising a pair of electrodes having therebetween at least one organic compound layer including a light-emitting layer, wherein the electroluminescent element comprises at least one complex represented by formula (1).

The element of the present invention is characterized in that the organic layer comprises a complex having a specific structure. The at least one organic layer is not particularly limited in its function and may be a hole injection layer, a hole transport layer, an electron injection layer, an electron transport layer, a hole blocking layer, an electron blocking layer, an exciton blocking layer, a protective layer or the like, other than a light-emitting layer. Also, the element of the present invention may have, in addition to the at least one organic layer, a hole injection layer, a hole transport layer, an electron injection layer, an electron transport layer, a hole blocking layer, an electron blocking layer, an exciton blocking layer, a protective layer and the like. These layers each may have other functions at the same time.

In the present invention, as for the embodiment of layer stacking in the organic layer, an embodiment that a hole transport layer, a light-emitting layer and an electron transport layer are stacked in this order from the anode side is preferred. Also, a charge blocking layer or the like may be provided between the hole transport layer and the light-emitting layer or between the light-emitting layer and the electron transport layer. Furthermore, a hole injection layer may be provided between the anode and the hole transport layer, and an electron injection layer may be provided between the cathode and the electron transport layer. Incidentally, each layer may be divided into a plurality of secondary layers.

The compound represented by formula (1) is preferably contained in a light-emitting layer or a layer (an electron injection layer, an electron transport layer, a hole blocking layer or an exciton blocking layer) present between the cathode and the light-emitting layer, more preferably in a light-emitting layer, a hole blocking layer or an exciton blocking layer, still more preferably in a light-emitting layer.

The complex represented by the present invention (1) of the present invention may be used, for example, as a hole injection material, a hole transport material, a host material, a light-emitting material, a hole blocking material, an exciton blocking material, an electron transport material or an electron injection material, and the complex is preferably used as a host material, a light-emitting material, a exciton blocking material or an electron transport material, more preferably as a host material or a light-emitting material, still more preferably as a host material.

The host material is a compound generally contained in the light-emitting layer together with a light-emitting material (a guest material, a fluorescent material or a phosphorescent material). The host material is preferably a compound mainly undertaking the injection or transport of an electric charge (an electron, a hole or both thereof) in the light-emitting layer. Also, a compound which itself emits substantially no light is preferred. The term "emits substantially no light" as used in the present invention means that the quantity of light emitted from the compound which emits substantially no light is preferably 5% or less, more preferably 3% or less, still more preferably 1% or less, based on the total light emission quantity of the entire element.

The concentration of the host material in the light-emitting layer is not particularly limited, but the host material is preferably a main component (a component having a largest content) in the light-emitting layer, and the concentration thereof is more preferably from 50 to 99.9 mass %, still more preferably from 70 to 99.8 mass %, yet still more preferably from 80 to 99.7 mass %, and most preferably from 90 to 99.5 mass %.

The glass transition point of the host material is preferably from 100 to 500° C., more preferably from 110 to 300° C., still more preferably from 120 to 250° C.

In the case where the complex of the present invention is contained as a light-emitting material in the light-emitting layer, the content thereof is preferably from 0.1 to 50 mass %, more preferably from 0.2 to 30 mass %, still more preferably from 0.3 to 20 mass %, and most preferably from 0.5 to 15 mass %, based on the total mass of the layer.

Formula (1) is described below. $M^{11}$ represents a hexacoordinate transition metal ion. The hexacoordinate transition metal ion is not particularly limited but is preferably a trivalent iridium ion, a trivalent rhodium ion a monovalent rhenium ion, a divalent ruthenium ion, a zero-valent tungsten ion or a tetravalent platinum ion, more preferably a trivalent iridium ion, a trivalent rhodium ion or a monovalent rhenium ion, still more preferably a trivalent iridium ion or a monovalent rhenium ion, yet still more preferably a trivalent iridium ion.

$Y^{11}$ represents a nitrogen atom or a substituted or unsubstituted carbon atom and is preferably a substituted or unsubstituted carbon atom, more preferably an unsubstituted carbon atom.

In the case where $Y^{11}$ is a carbon atom, examples of the substituent on the carbon atom include an alkyl group (preferably having a carbon number of 1 to 30, more preferably from 1 to 20, still more preferably from 1 to 10; e.g., methyl, ethyl, iso-propyl, tert-butyl, n-octyl, n-decyl, n-hexadecyl, cyclopropyl, cyclopentyl, cyclohexyl), an alkenyl group (preferably having a carbon number of 2 to 30, more preferably from 2 to 20, still more preferably from 2 to 10; e.g., vinyl, allyl, 2-butenyl, 3-pentenyl), an alkynyl group (preferably having a carbon number of 2 to 30, more preferably from 2 to 20, still more preferably from 2 to 10; e.g., propargyl, 3-pentynyl), an aryl group (preferably having a carbon number of 6 to 30, more preferably from 6 to 20, still more preferably from 6 to 12; e.g., phenyl, p-methylphenyl, naphthyl, anthranyl), an amino group (preferably having a carbon number of 0 to 30, more preferably from 0 to 20, still more preferably from 0 to 10; e.g., amino, methylamino, dimethylamino, diethylamino, dibenzylamino, diphenylamino, ditolylamino), an alkoxy group (preferably having a carbon number of 1 to 30, more preferably from 1 to 20, still more preferably from 1 to 10; e.g., methoxy, ethoxy, butoxy, 2-ethylhexyloxy), an aryloxy group (preferably having a carbon number of 6 to 30, more preferably from 6 to 20, still more preferably from 6 to 12; e.g., phenyloxy, 1-naphthyloxy, 2-naphthyloxy), a heterocyclic oxy group (preferably having a carbon number of 1 to 30, more preferably from 1 to 20, still more preferably from 1 to 12; e.g., pyridyloxy, pyrazinyloxy, pyrimidyloxy, quinolyloxy), an acyl group (preferably having a carbon number of 1 to 30, more preferably from 1 to 20, still more preferably from 1 to 12; e.g., acetyl, benzoyl, formyl, pivaloyl), an alkoxycarbonyl group (preferably having a carbon number of 2 to 30, more preferably from 2 to 20, still more preferably from 2 to 12; e.g., methoxycarbonyl, ethoxycarbonyl), an aryloxycarbonyl group (preferably having a carbon number of 7 to 30, more preferably from 7 to 20, still more preferably from 7 to 12; e.g., phenyloxycarbonyl), an acyloxy group (preferably having a carbon number of 2 to 30, more preferably from 2 to 20, still more preferably from 2 to 10; e.g., acetoxy, benzoyloxy), an acylamino group (preferably having a carbon number of 2 to 30, more preferably from 2 to 20, still more preferably from 2 to 10; e.g., acetylamino, benzoylamino), an alkoxycarbonylamino group (preferably having a carbon number of 2 to 30, more preferably from 2 to 20, still more preferably from 2 to 12; e.g., methoxycarbonylamino), an aryloxycarbonylamino group (preferably having a carbon number of 7 to 30, more preferably from 7 to 20, still more preferably from 7 to 12; e.g., phenyloxycarbonylamino), a sulfonylamino group (preferably having a carbon number of 1 to 30, more preferably from 1 to 20, still more preferably from 1 to 12; e.g., methanesulfonylamino, benzenesulfonylamino), a sulfamoyl group (preferably having a carbon number of 0 to 30, more preferably from 0 to 20, still more preferably from 0 to 12; e.g., sulfamoyl, methylsulfamoyl, dimethylsulfamoyl, phenylsulfamoyl), a carbamoyl group (preferably having a carbon number of 1 to 30, more preferably from 1 to 20, still more preferably from 1 to 12; e.g., carbamoyl, methylcarbamoyl, diethylcarbamoyl, phenylcarbamoyl), an alkylthio group (preferably having a carbon number of 1 to 30, more preferably from 1 to 20, still more preferably from 1 to 12; e.g., methylthio, ethylthio), an arylthio group (preferably having a carbon number of 6 to 30, more preferably from 6 to 20, still more preferably from 6 to 12; e.g., phenylthio), a heterocyclic thio group (preferably having a carbon number of 1 to 30, more preferably from 1 to 20, still more preferably from 1 to 12; e.g., pyridylthio, 2-benzimidazolylthio, 2-benzoxazolylthio, 2-benzothiazolylthio) a sulfonyl group (preferably having a carbon number of 1 to 30, more preferably from 1 to 20, still more preferably 1 to 12; e.g., mesyl, tosyl), a sulfinyl group (preferably having a carbon number of 1 to 30, more preferably from 1 to 20, still more preferably from 1 to 12; e.g., methanesulfinyl, benzenesulfinyl), a ureido group (preferably having a carbon number of 1 to 30, more preferably 1 to 20, still more preferably 1 to 12; e.g., ureido, methylureido, phenylureido), a phosphoric acid amide group (preferably having a carbon number of 1 to 30, more preferably from 1 to 20, still more preferably from 1 to 12, e.g., diethylphosphoric acid amide, phenylphosphoric acid amide), a hydroxyl group, a mercapto group, a halogen atom (e.g., fluorine, chlorine, bromine, iodine), a cyano group, a sulfo group, a carboxyl group, a nitro group, a hydroxamic acid group, a sulfino group, a hydrazino group, an imino group, a heterocyclic group (preferably having a carbon number of 1 to 30, more preferably from 1 to 12; the heteroatom includes, for example, a nitrogen atom, an oxygen atom and a sulfur atom; specific examples of the heterocyclic group include imidazolyl, pyridyl, quinolyl, furyl, thienyl, piperidyl, morpholino, benzoxazolyl, benzimidazolyl, benzothiazolyl, carbazolyl and azepinyl), a silyl group (preferably having a carbon number of 3 to 40, more preferably from 3 to 30, still more preferably from 3 to 24; e.g., trimethylsilyl, triphenylsilyl) and a silyloxy group (preferably having a carbon number of 3 to 40, more preferably from 3 to 30, still more preferably from 3 to 24; e.g., trimethylsilyloxy, triphenylsilyloxy). These substituents each may be further substituted.

$L^{11}$ represents a ligand. Examples of the ligand include the ligands described in H. Yersin, *Photochemistry and Photophysics of Coordination Compounds*, Springer-Verlag (1987), and Akio Yamamoto, *Yuki Kinzoku Kagaku—Kiso to Oyo—(Organic Metal Chemistry—Basic and Application—)*, Shokabo (1982). Preferred examples thereof include an organic metal ligand (a ligand coordinated through carbon), a halogen ligand (e.g., chlorine, fluorine), a nitrogen-containing heterocyclic ligand (for example, a bipyridyl ligand, a phenanthroline ligand, a phenylpyridine ligand, a pyrazolylpyridine ligand, a benzimidazolylpyridine ligand, a picolinic acid ligand, a thienylpyridine ligand, a pyrazolylpyridine ligand, an imidazolylpyridine ligand, a triazolylpyridine ligand, a pirazolylbenzoxazole ligand and a condensed ring thereof (e.g., phenylquinoline, benzothienylpyridine, biquinoline)), a diketone ligand (e.g., acetylacetone), a nitrile ligand (e.g., acetonitrile), a CO ligand, an isonitrile ligand (e.g., tert-butylisonitrile), a carbene ligand (e.g., diamino-substituted carbene), a phosphorus ligand (e.g., phosphine derivative, phosphorous ester derivative, phosphinine derivative), and a carboxylic acid ligand (e.g., acetic acid). Among these, more preferred are a diketone ligand and a bidentate nitrogen-containing heterocyclic ligand, and still more preferred is a bidentate nitrogen-containing heterocyclic ligand coordinated through carbon atom and nitrogen atom.

$Q^{11}$ and $Q^{12}$ each represents an atomic group for forming a nitrogen-containing heterocyclic ring. The nitrogen-containing heterocyclic ring formed by $Q^{11}$ and $—Y^{11}=C—N—$ is preferably a 5-membered nitrogen-containing heterocyclic ring or a condensed ring thereof, more preferably a pyrrole ring, a pyrazole ring, an imidazole ring, a triazole ring or a condensed ring thereof, still more preferably a pyrrole ring, a pyrazole ring, an imidazole ring, a triazole ring or a condensed ring thereof, yet still more preferably a pyrazole ring, an imidazole ring or a triazole ring, and even yet still more preferably a pyrazole ring.

The nitrogen-containing heterocyclic ring formed by $Q^{12}$ and $—C=N—$ is preferably a 5- or 6-membered nitrogen-containing heterocyclic ring or a condensed ring thereof, more preferably a pyridine ring, a pyrazine ring, a pyrimidine ring, a triazine ring, an oxazole ring, a thiazole ring, an imidazole ring, a pyrazole ring, a pyrrole ring, a triazole ring or a condensed ring thereof, still more preferably a pyridine ring, a pyrazine ring, an imidazole ring or a pyrazole ring or a condensed ring thereof, yet still more preferably a pyridine ring or a condensed imidazole ring.

$n^{11}$ represents an integer of 1 to 3 and is preferably 2 or 3, more preferably 3. $n^{12}$ represents an integer of 0 to 4 and is preferably 0, 1 or 2, more preferably 0 or 1, still more preferably 0. The combination of $n^{11}$ and $n^{12}$ is preferably a combination of forming a hexacoordinate complex as the compound of formula (1).

$X^{11}$ represents a counter ion. The counter ion is not particularly limited but is preferably an alkali metal ion, an alkaline earth metal ion, a halogen ion, a perchlorate ion, a $PF_6$ ion, an ammonium ion (e.g., tetramethylammonium ion), a borate ion or a phosphonium ion, more preferably a perchlorate ion or a $PF_6$ ion.

$n^{13}$ represents an integer of 0 to 3 and is preferably 0 or 1, more preferably 0.

The complex represented by formula (1) is preferably a complex represented by formula (2). Formula (2) is described below.

$M^{21}$ has the same meaning as $M^{11}$, and its preferred range is also the same. $Y^{21}$ to $Y^{27}$ each represents a nitrogen atom or a substituted or unsubstituted carbon atom. Examples of the substituent on the carbon atom are the same as those of the substituent described above for $Y^{11}$. The substituents on $Y^{21}$ to $Y^{27}$ may combine with each other to form a condensed ring structure.

$Y^{21}$ is preferably an unsubstituted carbon atom, $Y^{22}$ is preferably a substituted carbon atom, and $Y^{23}$ is preferably a nitrogen atom. $Y^{24}$ to $Y^{27}$ each is preferably a substituted or unsubstituted carbon atom, more preferably an unsubstituted carbon atom.

The substituent group on the carbon atom on $Y^{22}$ preferably includes, for example; an alkyl group (preferably with 1 to 30 carbon atoms, more preferably with 2 to 20 carbon atoms, and particularly preferably with 1 to 10 carbon atoms, exemplified by methyl, ethyl, iso-bropyl, tert-butyl, n-octyl, n-decyl, n-hexadecyl, cyclopropyl, cyclopentyl, and cyclohexyl); an aryl group (preferably with 6 to 30 carbon atoms, more preferably with 6 to 20 carbon atoms, and particularly preferably with 6 to 12 carbon atoms, exemplified by phenyl, p-methylphenyl, naphthyl and anthranyl), a heterocyclic group (preferably with 1 to 30 carbon atoms, and more preferably with 1 to 12 carbon atoms, wherein the hetero atom is, for example, a nitrogen atom, an oxygen atom or a sulfur atom, and specific compounds being, for example, imidazolyl, pyridyl, quinolyl, furyl, thienyl, piperidyl, morpholino, benzoxazolyl, benzimidazolyl, benzthiazolyl, carbazolyl and azepinyl); an alkoxy group (preferably with 1 to 30 carbon atoms, more preferably with 1 to 20 carbon atoms, and particularly preferably with 1 to 10 carbon atoms, exemplified by methoxy, ethoxy, butoxy, 2-ethylhexyloxy); a halogen atom (exemplified by fluorine, chlorine, bromine and iodine atoms); and a cyano group.

These substituent groups may further be substituted.

$L^{21}$ has the same meaning as $L^{11}$, and its preferred range is also the same. $n^{21}$ represents an integer of 1 to 3 and is preferably 2 or 3, more preferably 3. $n^{22}$ represents an integer of 0 to 4 and is preferably 0, 1 or 2, more preferably 0 or 1, still more preferably 0. The combination of $n^{21}$ and $n^{22}$ is preferably a combination of forming a hexacoordinate complex as the compound of formula (2).

In the case where the compound represented by formula (1) is a hexacoordinate complex, the steric structure thereof may be a fac form, a mer form or a mixture thereof, but a fac form preferably predominates and more preferably occupies 99% or more. For example, Compound (1-1) shown later is preferably predominated by a fac form.

The phosphorescence quantum yield of the phosphorescent material (the compound represented by formula (1) or other phosphorescent materials) for use in the organic electroluminescent element of the present invention is preferably 30% or more, more preferably 50% or more, still more preferably 70% or more, yet still more preferably 90% or more.

The phosphorescence quantum yield of the phosphorescent material can be measured, for example, by comparing the light emission quantity when the phosphorescent material dissolved in an organic solvent (e.g., toluene, dichloroethane) (for example, to a concentration of $1\times10^{-3}$ mol/liter) is freeze-deaerated and irradiated with light at room temperature, with that of a material having a known absolute fluorescence quantum yield (e.g., fluorescein, anthracene, rhodamine).

The phosphorescence life of the phosphorescent material is preferably 10 μs or less, more preferably 5 μs or less, still more preferably 3 μm or less.

The phosphorescence life of the phosphorescent material can be determined, for example, by measuring the light emission life when the phosphorescent material dissolved in an organic solvent (e.g., toluene, dichloroethane) (for example, to a concentration of $1\times10^{-3}$ mol/liter) is freeze-deaerated and irradiated with light at room temperature.

The compound represented by formula (1) may be a low molecular compound or may be an oligomer compound or a polymer compound having a complex in the main or side chain (the weight average molecular weight (polystyrene-reduced) is preferably from 1,000 to 5,000,000, more preferably from 2,000 to 1,000,000, still more preferably from 3,000 to 100,000). The compound represented by formula (1) is preferably a low molecular compound.

The external quantum efficiency of the light-emitting element of the present invention is preferably 5% or more, more preferably 10% or more, still more preferably 13% or more. As for the numerical value of the external quantum efficiency, a maximum value of the external quantum efficiency when the element is driven at 20° C., or a value of the external quantum efficiency in the vicinity of 100 to 300 cd/m² when the element is driven at 20° C., can be used.

The internal quantum efficiency of the light-emitting element of the present invention is preferably 30% or more, more preferably 50% or more, still more preferably 70% or more. The internal quantum efficiency of the element is calculated by:

internal quantum efficiency=external quantum efficiency/light take-out efficiency In the normal organic EL element, the light take-out efficiency is 20%, but the light take-out efficiency can be increased to 20% or more by designing the shape of substrate, the shape of electrode, the thickness of organic layer, the thickness of inorganic layer, the refractive index of organic layer, the refractive index of inorganic layer or the like.

The light-emitting element of the present invention is preferably an element comprising at least three layers of a hole transport layer, a light-emitting layer and an electron transport layer.

The ionization potential of the host material contained in the light-emitting layer of the present invention is preferably from 5.8 to 6.3 eV, more preferably from 5.95 to 6.25 eV, still more preferably from 6.0 to 6.2 eV.

The electron mobility of the host material in the light-emitting layer is preferably from $1\times10^{-6}$ to $1\times10^{-1}$ cm/vs, more preferably from $5\times10^{-6}$ to $1\times10^{-2}$ cm/Vs, still more preferably from $1\times10^{-5}$ to $1\times10^{-2}$ cm/Vs, yet still more preferably from $5\times10^{-5}$ to $1\times10^{-2}$ cm/Vs.

The hole mobility of the host material in the light-emitting layer is preferably from $1\times10^{-6}$ to $1\times10^{-1}$ cm/Vs, more preferably from $5\times10^{-6}$ to $1\times10^{-2}$ cm/Vs, still more preferably from $1\times10^{-5}$ to $1\times10^{-2}$ cm/Vs, yet still more preferably from $5\times10^{-5}$ to $1\times10^{-2}$ cm/Vs.

The host material contained in the light-emitting layer of the present invention, the electron transport layer and the hole transport material each preferably has a glass transition point of 90 to 400° C., more preferably from 100 to 380° C., still more preferably from 120 to 370° C., yet still more preferably from 140 to 360° C.

In the organic electroluminescent element of the present invention, in view of blue color purity, the emission peak wavelength is preferably from 390 to 495 nm, more preferably from 400 to 490 nm. The light-emitting element of the present invention may also have an emission peak wavelength at 500 nm or more and may be a white light-emitting element.

In the organic electroluminescent element of the present invention, in view of blue color purity, the x value of emitted light in CIE chromaticity coordinates is preferably 0.22 or less, more preferably 0.20 or less.

In the organic electroluminescent element of the present invention, in view of blue color purity, the y value of emitted light in CIE chromaticity coordinates is preferably 0.25 or less, more preferably 0.20 or less, still more preferably 0.15 or less.

In the organic electroluminescent element of the present invention, in view of blue color purity, the half-width of the emission spectrum is preferably 100 nm or less, more preferably 90 nm or less, still more preferably 80 nm or less, yet still more preferably 70 nm or less.

The $T_1$ level (an energy level in the lowest triplet excited state) of the phosphorescent material (the compound represented by formula (1) or other phosphorescent materials) which can be used in the present invention is preferably from 60 Kcal/mol (251.4 KJ/mol) to 90 Kcal/mol (377.1 KJ/mol), more preferably from 62 Kcal/mol (259.78 KJ/mol) to 85 Kcal/mol (356.15 KJ/mol), still more preferably from 65 Kcal/mol (272.35 KJ/mol) to 80 Kcal/mol (335.2 KJ/mol).

The $T_1$ level (an energy level in the lowest triplet excited state) of the host material in the light-emitting layer is preferably from 60 Kcal/mol (251.4 KJ/mol) to 90 Kcal/mol (377.1 KJ/mol), more preferably from 62 Kcal/mol (259.78 KJ/mol) to 85 Kcal/mol (356.15 KJ/mol), still more preferably from 65 Kcal/mol (272.35 KJ/mol) to 80 Kcal/mol (335.2 KJ/mol).

The $T_1$ level (an energy level in the lowest triplet excited state) of a layer (e.g., hole transport layer, electron transport layers charge blocking layer, exciton blocking layer) adjacent to the light-emitting layer is preferably from 60 Kcal/mol (251.4 KJ/mol) to 90 Kcal/mol (377.1 KJ/mol), more preferably from 62 Kcal/mol (259.78 KJ/mol) to 85 Kcal/mol (356.15 KJ/mol), still more preferably from 65 Kcal/mol (272.35 KJ/mol) to 80 Kcal/mol (335.2 KJ/mol).

Examples of the compounds for use in the present invention are set forth below, but the present invention is not limited thereto.

(1-1)

(1-2)

(1-3)

(1-4)

-continued

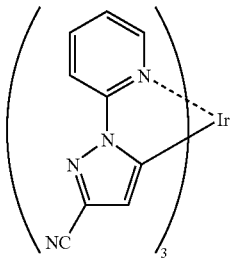
(1-5)

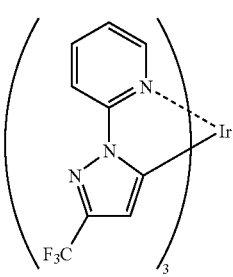
(1-6)

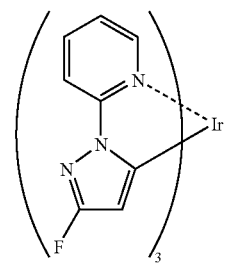
(1-7)

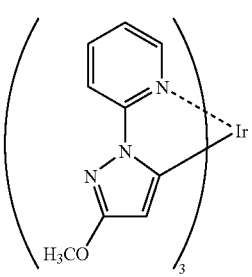
(1-8)

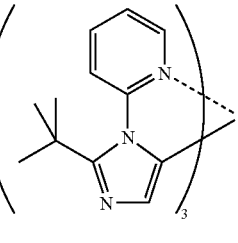
(1-9)

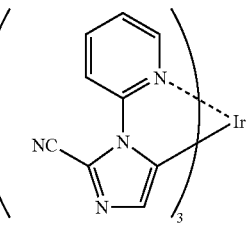
(1-10)

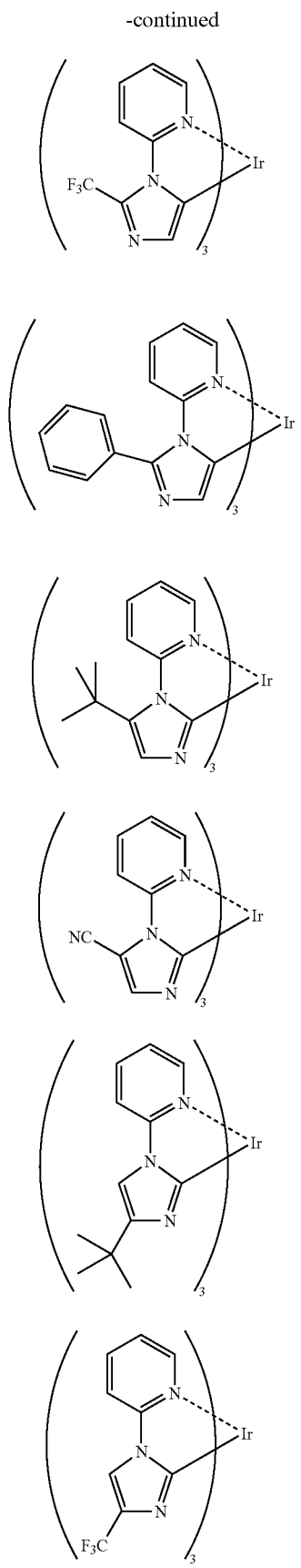
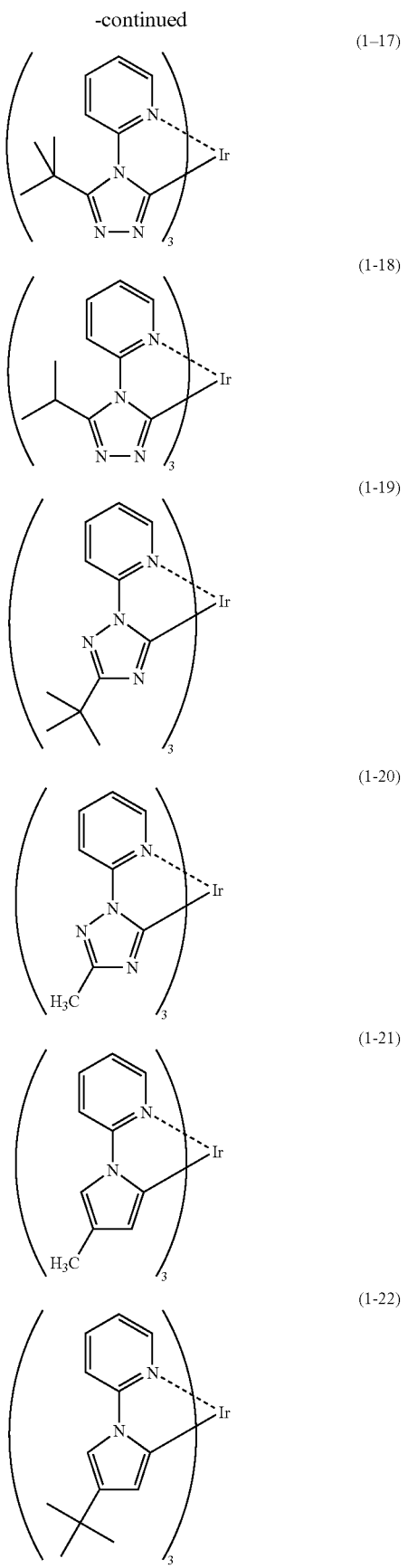

(1-23) 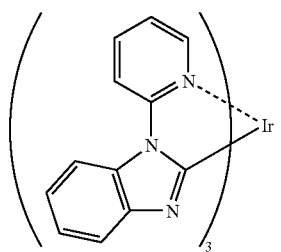
(1-24) 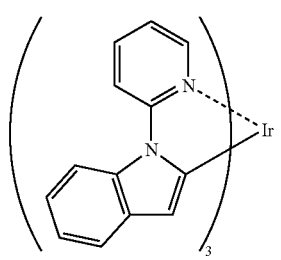
(1-25) 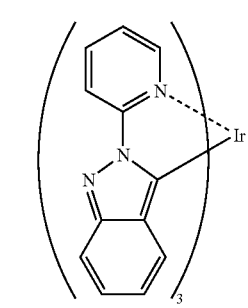
(1-26) 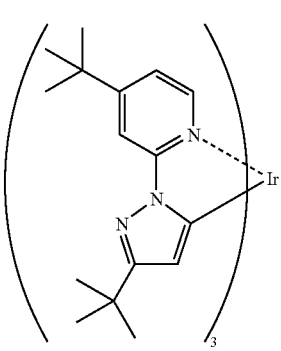
(1-27) 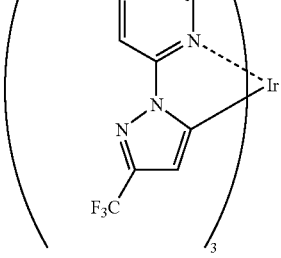
(1-28) 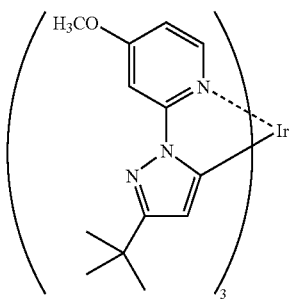
(1-29) 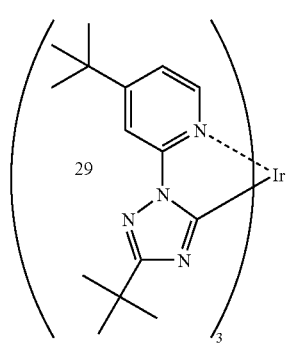
(1-30) 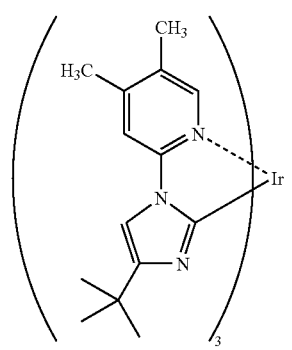
(1-31) 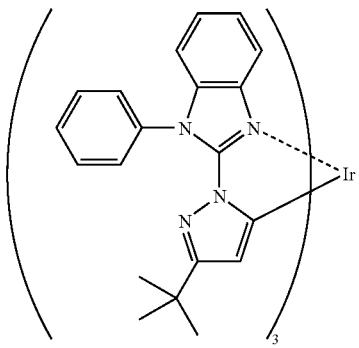

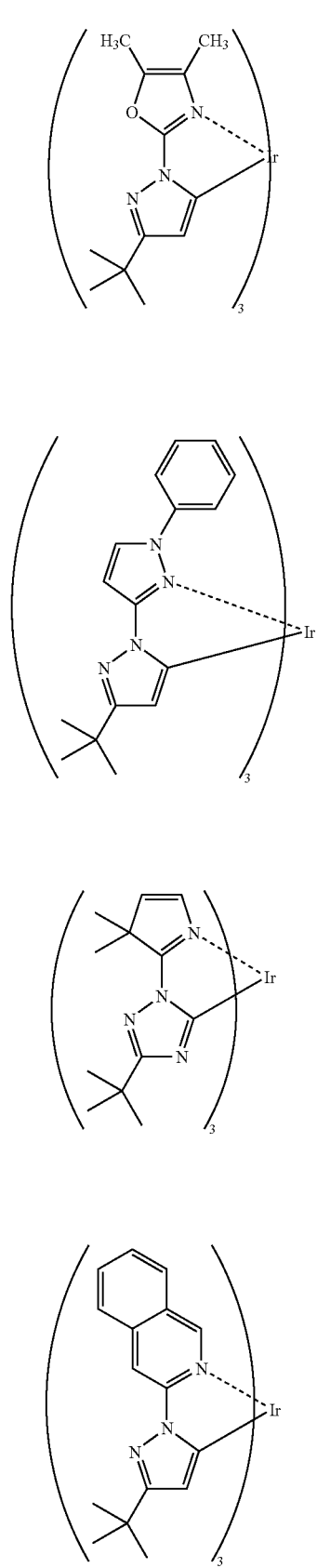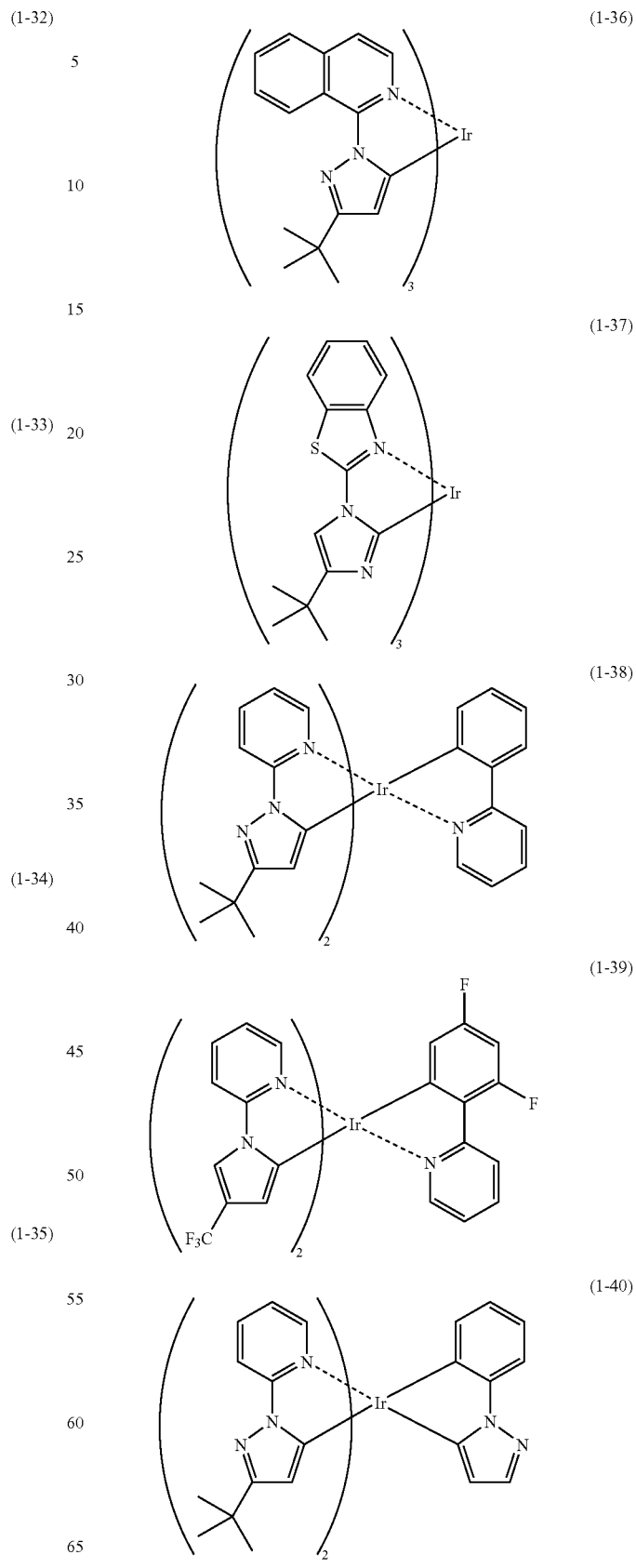

-continued
(1-41)
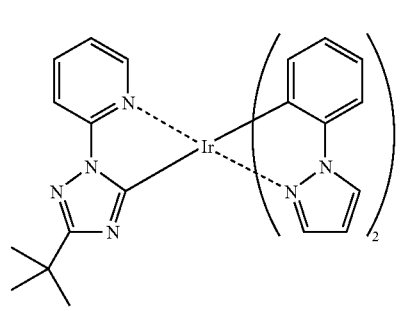
(1-42)
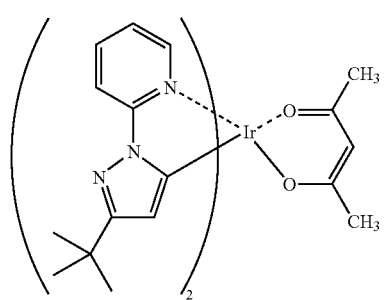
(1-43)
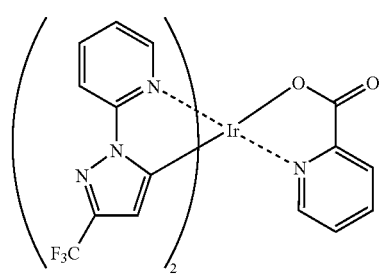
(1-44)
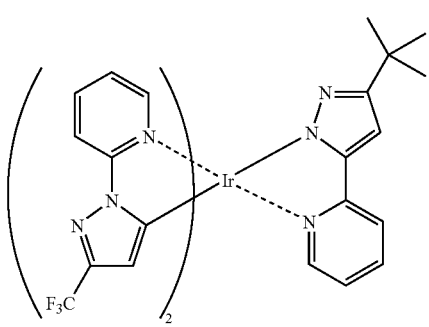
(1-45)
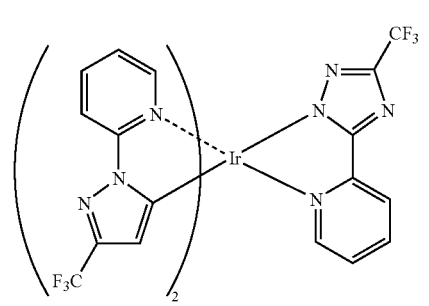
-continued
(1-46)
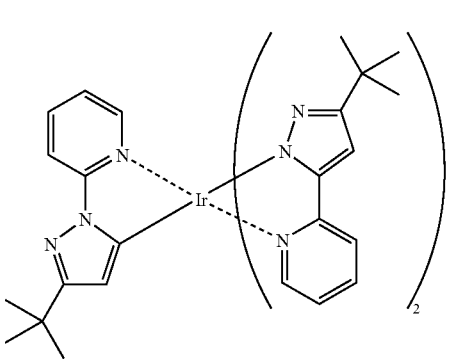
(1-47)
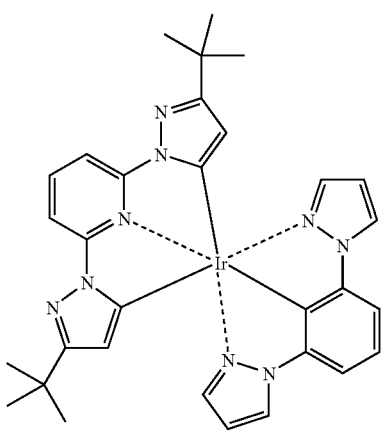
(1-48)
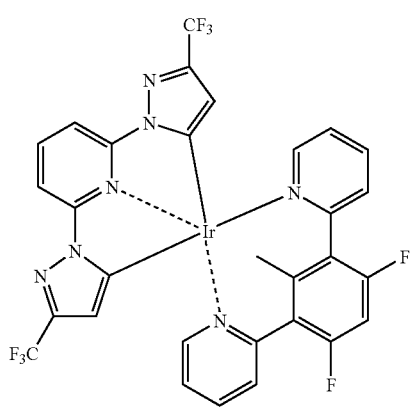
(1-51)
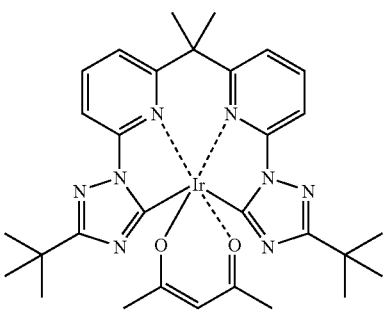

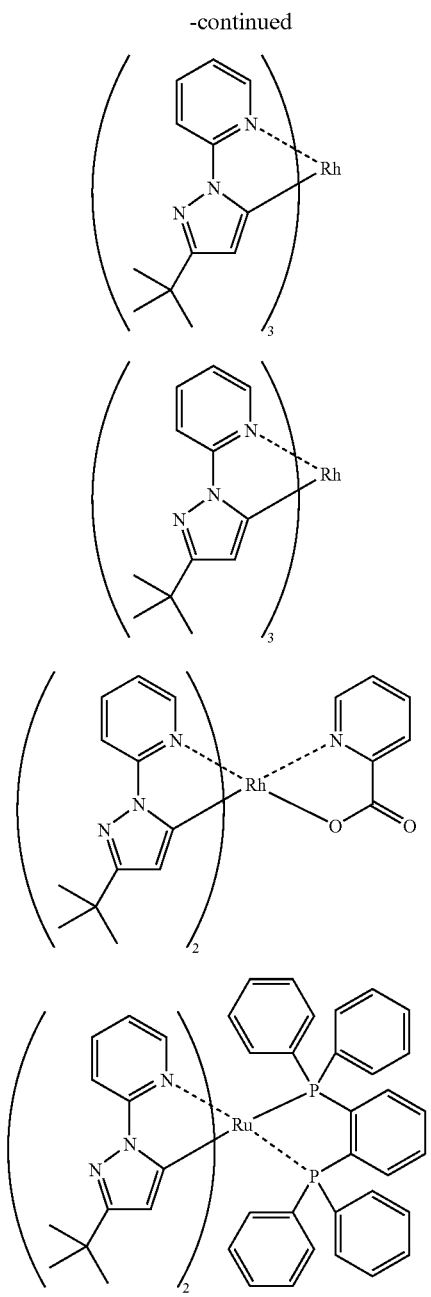

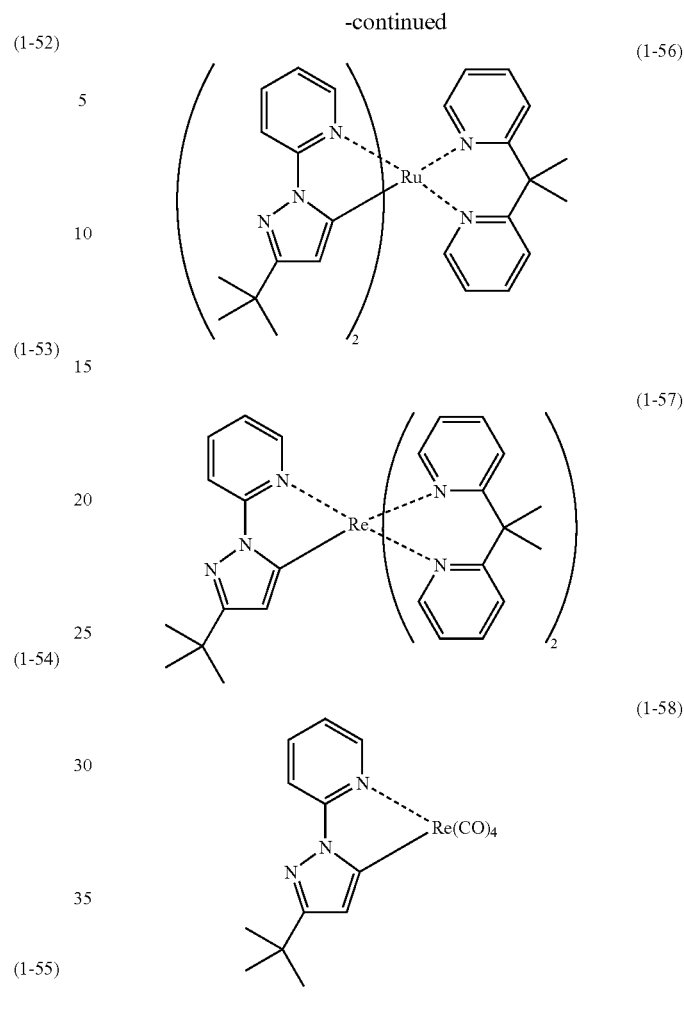

The compounds for use in the present invention can be synthesized by referring to known techniques. For example, the ligand of the compound represented by (1-1) can be synthesized by coupling a bromopyridine and a pyrazole derivative in the presence of a copper catalyst as shown below. Also, the compound represented by (1-1) can be synthesized from the ligand and a metal reagent (e.g., trisacetylactonato iridium (III), iridium chloride, potassium iridium chloride) in the same manner as the synthesis method of trisphenylpyridium-iridium(III) complex.

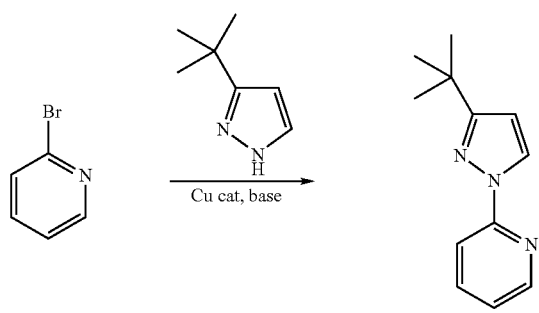

-continued

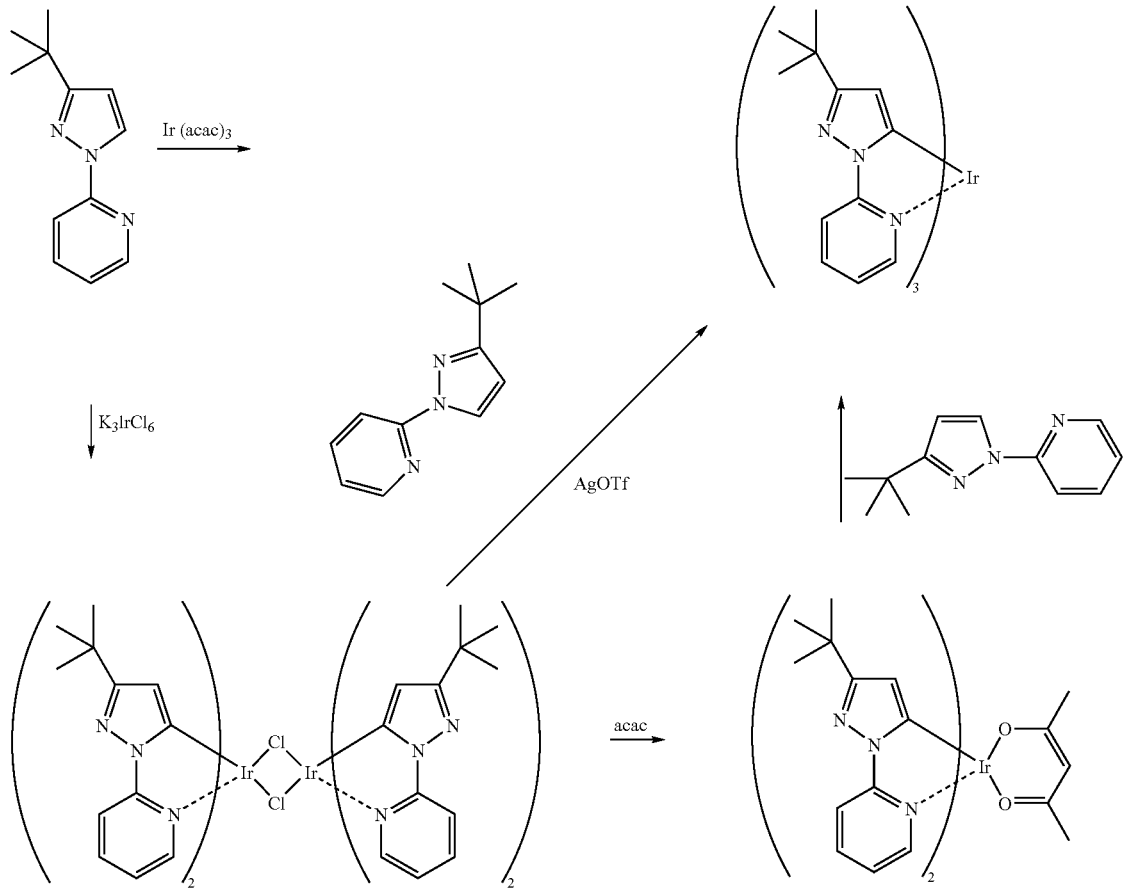

Examples of the solvent which can be used in the complexing reaction include acetonitrile, benzonitrile, acetic acid, ethanol, methoxyethanol, glycerol, water and a mixed solvent thereof. Additives (e.g., silver trifluoromethanesulfonate) for activating the reaction may be added or the reaction may be performed in the presence of an inert gas (e.g., nitrogen, argon).

The reaction temperature is not particularly limited but is preferably from −30 to 400° C., more preferably from 0 to 350° C., still more preferably from 25 to 300° C.

The organic electroluminescent element of the present invention is described below. The organic electroluminescent element of the present invention is applicable to any system, driving method, utilization mode or the like. The organic electroluminescent element representatively includes an organic EL (electroluminescent) device.

The light take-out efficiency of the light-emitting element of the present invention can be enhanced by various known techniques. For example, the light take-out efficiency and in turn the external quantum efficiency can be enhanced by processing the surface profile of substrate (e.g., formation of a fine irregular pattern), controlling the refractive index of substrate, ITO layer or organic layer, or controlling the film thickness of substrate, ITO layer or organic layer.

The light-emitting element of the present invention may take a so-called top emission system of taking out light from the cathode side (see, for example, JP-A-2003-208109, JP-A-2003-248441, JP-A-2003-257651 and JP-A-2003-282261).

The substrate for use in the light-emitting element of the present invention is not particularly limited but may be an inorganic material such as zirconia-stabilized yttrium and glass, or a high molecular weight material such as polyester (e.g., polyethylene terephthalate, polybutylene terephthalate, polyethylene naphthalate), polyethylene, polycarbonate, polyethersulfone, polyarylate, allyldiglycol carbonate, polyimide, polycycloolefin, norbornene resin, poly(chlorotrifluoroethylene), Teflon (registered trademark) and a polytetrafluoroethylene-polyethylene copolymer.

The organic electroluminescent element of the present invention may contain a blue fluorescent compound. Also, a multicolor or full-color light-emitting device may be fabricated by simultaneously using a blue light-emitting element containing a blue fluorescent compound and the light-emitting element of the present invention.

The light-emitting layer of the organic electroluminescent element of the present invention may have at least one stacked layer structure, and the number of layers stacked is preferably from 2 to 50, more preferably from 4 to 30, still more preferably from 6 to 20.

The film thickness of each layer constituting the layer stack is not particularly limited but is preferably from 0.2 to 20 nm, more preferably from 0.4 to 15 nm, still more preferably from 0.5 to 10 nm, yet still more preferably from 1 to 5 nm.

The light-emitting layer of the organic electroluminescent element of the present invention may have a multi-domain structure. Also, the light-emitting layer may have other domain structures therein. For example, the light-emitting layer may consist of a region of about 1 nm$^3$ comprising a mixture of a host material A and a fluorescent material B and a region of about 1 nm$^3$ comprising a mixture of a host material C and a fluorescent material D. The diameter of each domain is preferably from 0.2 to 10 nm, more preferably from 0.3 to 5 nm, still more preferably from 0.5 to 3 nm, yet still more preferably from 0.7 to 2 nm.

The method for forming the organic layer of the light-emitting element comprising the compound of the present invention is not particularly limited, but examples of the method include a resistance heating vapor deposition method, an electron beam method, a sputtering method, a molecular lamination method, a coating method (e.g., spray coating, dip coating, impregnation, roll coating, gravure coating, reverse coating, roll brush coating, air knife coating, curtain coating, spin coating, flow coating, bar coating, microgravure coating, air doctor coating, blade coating, squeegee coating, transfer roll coating, kiss coating, casting, extrusion coating, wire bar coating, screen coating), an inkjet method, a printing method and a transfer method. Among these, a resistance heating vapor deposition method, a coating method and a transfer method are preferred in view of performance and production.

The light-emitting element of the present invention is an element obtained by forming a light-emitting layer or a plurality of organic compound films including a light-emitting layer, between a pair of electrodes, that is, anode and cathode. The light-emitting element may also have a hole injection layer, a hole transport layer, an electron injection layer, an electron transport layer, a protective layer and the like, in addition to the light-emitting layer. These layers each may have other functions. For the formation of each layer, various materials may be used.

The anode supplies holes to a hole injection layer, a hole transport layer, a light-emitting layer or the like, and examples of the material used for the anode include a metal, an alloy, a metal oxide, an electrically conducting compound and a mixture thereof. A material having a work function of 4 eV or more is preferred. Specific examples thereof include an electrically conducting metal oxide such as tin oxide, zinc oxide, indium oxide and indium tin oxide (ITO); a metal such as gold, silver, chromium and nickel; a mixture or laminate of these metal and electrically conducting metal oxide; an electrically conducting inorganic material such as copper iodide and copper sulfide; an electrically conducting organic material such as polyaniline, polythiophene and polypyrrole; and a laminate of such an electrically conducting material and ITO. Among these, an electrically conducting metal oxide is preferred, and ITO is more preferred in view of productivity, high conductivity, transparency and the like. The film thickness of the anode may be appropriately selected according to the material, but usually, the film thickness is preferably from 10 nm to 5 µm, more preferably from 50 nm to 1 µm, still more preferably from 100 to 500 nm.

The anode is usually a layer formed on a soda-lime glass, a non-alkali glass, a transparent resin substrate or the like. In the case of using a glass, the construction material thereof is preferably a non-alkali glass so as to cause less elution of ion from the glass. Also, in the case of using a soda-lime glass, the soda-lime glass is preferably used after applying thereto a barrier coat such as silica. The thickness of the substrate is not particularly limited as long as it is large enough to maintain the mechanical strength, but in the case of using a glass, the thickness is usually 0.2 mm or more, preferably 0.7 mm or more.

For the production of the anode, various methods are used according to the material but, for example, in the case of ITO, the film formation is performed by an electron beam method, a sputtering method, a resistance heating vapor deposition method, a chemical reaction method (e.g., sol-gel method), a method of coating a dispersion of indium tin oxide, or the like.

The anode may be subjected to cleaning or other treatments so as to decrease the driving voltage of the element or increase the light emission efficiency. For example, in the case of ITO, a UV-ozone treatment, a plasma treatment and the like are effective.

The cathode supplies electrons to an electron injection layer, an electron transport layer, a light-emitting layer and the like, and the material is selected by taking account of, for example, ionization potential, stability, and adhesion to a layer adjacent to the negative electrode, such as electron injection layer, electron transport layer and light-emitting layer. Examples of the material which can be used for the cathode include a metal, an alloy, a metal halide, a metal oxide, an electrically conducting compound and a mixture thereof. Specific examples thereof include an alkali metal (e.g., Li, Na, K) including a fluoride or oxide thereof, an alkaline earth metal (e.g., Mg, Ca) including a fluoride or oxide thereof, gold, silver, lead, aluminum, a sodium-potassium alloy including a mixed metal thereof, a lithium-aluminum alloy including a mixed metal thereof, a magnesium-silver alloy including a mixed metal thereof, and a rare earth metal such as indium and ytterbium. A material having a work function of 4 eV or less is preferred, and aluminum, a lithium-aluminum alloy including a mixed metal thereof, and a magnesium-silver alloy including a mixed metal thereof are more preferred. The cathode may take not only a single-layer structure comprising the above-described compound or mixture but also a stacked layer structure comprising the above-described compound or mixture. For example, a stacked layer structure of aluminum/lithium fluoride or aluminum/lithium oxide is preferred. The thickness of the cathode may be appropriately selected according to the material but usually, the thickness is preferably from 10 nm to 5 µm, more preferably from 50 nm to 1 µm, still more preferably from 100 nm to 1 µm.

For the production of the cathode, an electron beam method, a sputtering method, a resistance heating vapor deposition method, a coating method, a transfer method and the like are used. The metal in an elementary form may be vapor-deposited or two or more components may be vapor-deposited at the same time. Furthermore, a plurality of metals may be simultaneously vapor-deposited to form an alloy electrode, or a previously prepared alloy may be vapor-deposited.

The sheet resistance of the anode and the cathode is preferably lower and is preferably hundreds of Ω/square or less.

The material for the light-emitting layer may be any material as long as it can form a layer having a function of injecting holes from the anode, hole injection layer or hole transport layer as well as injecting electrons from the cathode, electron injection layer or electron transport layer when an electric field is applied, a function of moving the injected electric charge, or a function of providing a site for recombining a hole and an electron to effect light emission. Examples of the material include, other than the compounds of the present invention, benzoxazole, benzimidazole, benzothiazole, styrylbenzene, polyphenyl, diphenylbutadiene, tetraphenylbutadiene, naphthalimide, coumarin, perylene, perynone, oxadiazole, aldazine, pyralidine, cyclopentadiene, bisstyrylanthracene, quinacridone, pyrrolopyridine, thiadiazolopyridine, cyclopentadiene, styrylamine, an aromatic dimethylidine compound, various metal complexes as represented by a metal or rare earth complex of 8-quinolinol, a polymer compound such as polythiophene, polyphenylene and polyphenylenevinylene, an organic silane, a complex as represented by iridium-trisphenylpyridine complex and platinum-porphyrin complex, and a derivative thereof. The film thickness of the light-emitting layer is not particularly limited but usually, the thickness is preferably from 1 nm to 5 µm, more preferably from 5 nm to 1 µm, still more preferably from 10 to 500 nm.

The method for forming the light-emitting layer is not particularly limited, but examples of the method include a resistance heating vapor deposition method, an electron beam method, a sputtering method, a molecular lamination method, a coating method, an inkjet method, a printing method, an LB method and a transfer method. A resistance heating vapor deposition method and a coating method are preferred.

The light-emitting layer may be formed of a single compound or a plurality of compounds. Also, one light-emitting layer may be formed, or a plurality of light-emitting layers may be formed. In this case, respective layers may emit light differing in the color to give, for example, white light emission. The white light may also be emitted from a single light-emitting layer. In the case where a plurality of light-emitting layers are formed, each light-emitting layer may be formed of a single material or a plurality of compounds.

The material for the hole injection layer and hole transport layer may be sufficient if it has any one of a function of injecting holes from the anode, a function of transporting holes and a function of blocking electrons injected from the cathode. Specific examples of the material include carbazole, triazole, oxazole, oxadiazole, imidazole, polyarylalkane, pyrazoline, pyrazolone, phenylenediamine, arylamine, amino-substituted chalcone, styrylanthracene, fluorenone, hydrazone, stilbene, silazane, an aromatic tertiary amine compound, a styrylamine compound, an aromatic dimethylidine-based compound, a porphyrin-based compound, a polysilane-based compound, poly(N-vinylcarbazole), an aniline-based copolymer, an electrically conducting polymer or oligomer such as oligothiophene and polythiophene, an organic silane, a carbon film, the compounds of the present invention, and a derivative thereof. The film thickness of the hole injection layer and hole transport layer is not particularly limited but usually, the thickness is preferably from 1 nm to 5 µm, more preferably from 5 nm to 1 µm, still more preferably from 10 to 500 nm. The hole injection layer and the hole transport layer each may have a single-layer structure comprising one species or two or more species of the above-described materials or may have a multilayer structure comprising a plurality of layers having the same or different compositions.

As for the method of forming the hole injection layer and hole transport layer, a vacuum vapor deposition method, an LB method, a method of dissolving or dispersing the above-described hole injection/transport material in a solvent and coating the obtained solution, an inkjet method, a printing method and a transfer method are used. In the case of a coating method, the material can be dissolved or dispersed together with a resin component, and examples of the resin component include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin and silicon resin.

The material for the electron injection layer and electron transport layer may be sufficient if it has any one of a function of injecting electrons from the cathode, a function of transporting electrons and a function of blocking holes injected from the anode. Specific examples of the material include triazole, oxazole, oxadiazole, imidazole, fluorenone, anthraquinodimethane, anthrone, diphenylquinone, thiopyran dioxide, carbodiimide, fluorenylidenemethane, distyrylpyrazine, a tetracarboxylic acid anhydride of an aromatic ring (e.g., naphthalene, perylene), phthalocyanine, a metal complex of 8-quinolinol, metal phthalocyanine, various metal complexes as represented by a metal complex having a benzoxazole or benzothiazole ligand, an organic silane, and a derivative thereof. The film thickness of the electron injection layer and electron transport layer is not particularly limited but usually, the thickness is preferably from 1 nm to 5 µm, more preferably from 5 nm to 1 µm, still more preferably from 10 to 500 nm. The electron injection layer and the electron transport layer each may have a single-layer structure comprising one species or two or more species of the above-described materials or may have a multilayer structure comprising a plurality of layers having the same or different compositions.

As for the method of forming the electron injection layer and electron transport layer, a vacuum vapor deposition method, an LB method, a method of dissolving or dispersing the above-described electron injection/transport material in a solvent and coating the obtained solution, an inkjet method, a printing method, a transfer method and the like are used. In the case of a coating method, the material can be dissolved or dispersed together with a resin component. With respect to the resin component, for example, those described above in connection with the hole injection/transport layer can be applied.

The material for the protective layer may be sufficient if it has a function of preventing an element deterioration-accelerating material such as water and oxygen from entering into the element. Specific examples of the material include a metal such as In, Sn, Pb, Au, Cu, Ag, Al, Ti and Ni, a metal oxide such as MgO, SiO, $SiO_2$, $Al_2O_3$, GeO, NiO, CaO, BaO, $Fe_2O_3$, $Y_2O_3$ and $TiO_2$, a metal fluoride such as $MgF_2$, LiF, $AlF_3$ and $CaP_2$, a nitride such as $SiN_x$ and $SiO_xN_y$, polyethylene, polypropylene, polymethyl methacrylate, polyimide, polyurea, polytetrafluoroethylene, polychlorotrifluoroethylene, polydichlorofluoroethylene, a copolymer of chlorotrifluoroethylene and dichlorodifluoroethylene, a copolymer obtained by copolymerizing a monomer mixture containing tetrafluoroethylene and at least one comonomer, a fluorine-containing copolymer having a cyclic structure in the copolymer main chain, a water-absorbing substance having a water absorption percentage of 1% or more, and a moisture-resistant substance having a water absorption percentage of 0.1% or less.

The method for forming the protective layer is also not particularly limited and, for example, a vacuum vapor deposition method, a sputtering method, a reactive sputtering method, an MBE (molecular beam epitaxy) method, a cluster ion beam method, an ion plating method, a plasma polymerization method (high frequency-excited ion plating method), a plasma CVD method, a laser CVD method, a heat CVD method, a gas source CVD method, a coating method, a printing method and a transfer method can be applied.

The light-emitting element of the present invention is not particularly limited in its usage but can be suitably used in the fields of display device, display, backlight, electrophotography, illumination light source, recording light source, expo-

EXAMPLES

The present invention is described in greater detail below by referring to Examples, but the embodiment of the present invention is not limited thereto.

Synthesis of Exemplary Compound (1-1)

Under nitrogen gas flow, a ligand (0.24 g, 1.2 mmole), iridium acetylacetonate (0.2 g, 0.40 mmole) and 5 ml of glycerol were placed in a reaction vessel and agitated at 180° C. for 6 hr. After left for cooling, the reaction mixture was added with water, and extracted with chloroform. The extract was concentrated to separate crude crystals. Peaks corresponding to MH$^+$ (794) were confirmed by means of MALDI-MS.

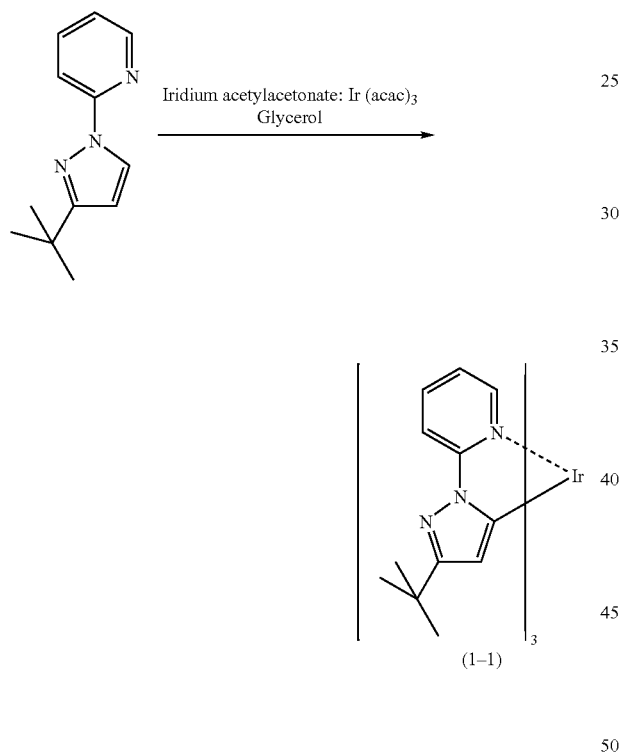

Synthesis of Exemplary Compound (1-6)

Under nitrogen gas flow, a mixture comprising a ligand (0.25 g, 1.2 mmole), iridium chloride hydrate (0.14 g, 0.40 mmole), trifluoroacetic acid (0.35 g, 1.6 mmole) and 2 ml of water were agitated at room temperature for 10 min. Thereafter, 15 ml of o-dichlorobenzene was added and the resulting mixture was agitated at 150° C. for 6 hr. After left for cooling, the reaction mixture was subjected to filtration to remove the insoluble matter, and then the o-dichlorobenzene was purged out by distillation. To the residue, hexane was added, and under nitrogen gas flow, the mixture was stirred at room temperature for 30 min, and then filtered to obtain 0.4 g of crude crystals Peaks corresponding to MH$^+$ (830) were confirmed by means of MALDI-MS.

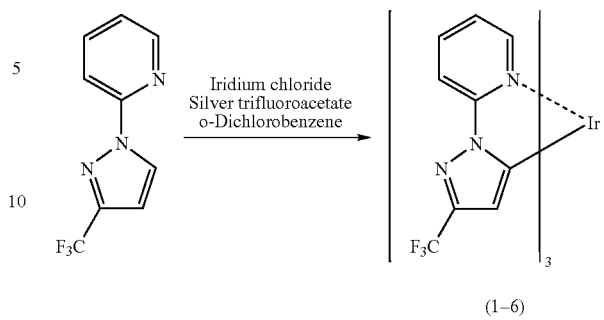

Comparative Example 1

Light-Emitting Element Described in JP-A-2004-221065

A cleaned ITO substrate was placed in a vapor deposition apparatus, and TPD (N,N'-diphenyl-N,N'-di(tolyl)-benzidine) was vapor-deposited thereon to a thickness of 50 nm. Subsequently, Compound (1-24) shown below, described in JP-A-2004-221065, and Ir(ppy)$_3$ shown below were vapor-deposited thereon at a ratio of 17:1 (by mass) to a thickness of 36 nm, and Compound A shown below was vapor-deposited thereon to a thickness of 36 nm. Furthermore, lithium fluoride was vapor-deposited thereon to a thickness of about 1 nm, and aluminum was then vapor-deposited to a thickness of 200 nm to produce a cathode, thereby completing an element. A constant DC voltage was applied to the EL element by using Source-Measure Unit Model 2400 manufactured by Toyo Corp., as a result, green light emission derived from Ir(ppy)$_3$ was obtained.

Ir(ppy)$_3$:

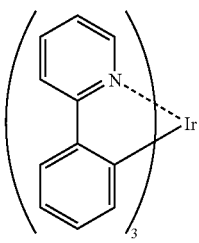

Compound (1-24) described in JP-A-2004-221065:

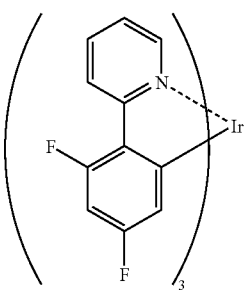

Compound A:

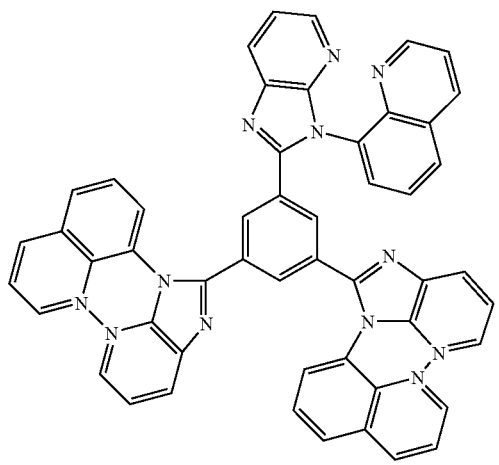

NPD:

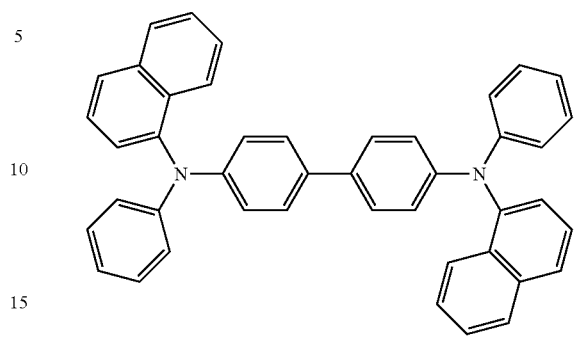

BAlq:

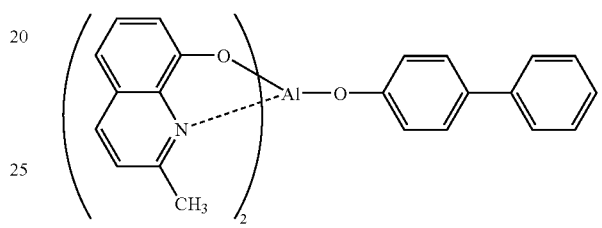

Alq:

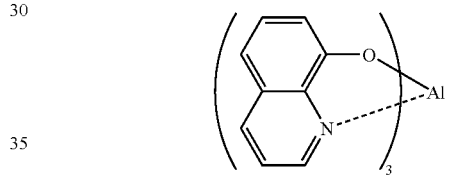

Example 1

An element was produced and evaluated in the same manner as in Comparative Example 1 except that in Comparative Example 1, Compound (1-1) of the present invention was used in place of Compound (1-24) described in JP-A-2004-221065, As a result, green light emission derived from Ir(ppy)$_3$ was obtained. The half-life of brightness of the element when driven at 1 mA (light emission area: 4 mm$^2$) was about twice that of the element of Comparative Example 1. Also, the element driving voltage necessary for flowing a current of 1 mA (light emission area: 4 mm$^2$) was decreased by about 1 V.

Example 2

A cleaned ITO substrate was placed in a vapor deposition apparatus, and copper phthalocyanine was vapor-deposited thereon to a thickness of 10 nm. Subsequently, NPD (N,N'-di-α-naphthyl-N,N'-diphenylbenzidine) was vapor-deposited thereon to a thickness of 20 nm, Compound (1-1) of the present invention and Ir(ppy)$_3$ were vapor-deposited thereon at a ratio of 17:1 (by mass) to a thickness of 36 nm, BAlq shown below was vapor-deposited thereon to a thickness of 10 nm, and Alq (tris(8-hydroxyquinoline) aluminum complex) shown below was further vapor-deposited thereon to a thickness of 40 nm. Furthermore, lithium fluoride was vapor-deposited thereon to a thickness of 3 nm, and aluminum was then vapor-deposited to a thickness of 60 nm, thereby producing an element. A constant DC voltage was applied to the EL element by using Source-Measure Unit Model 2400 manufactured by Toyo Corp., as a result, green light emission derived from Ir(ppy)$_3$ was obtained. The half-life of brightness of the element when driven at 1 mA (light emission area: 4 mm$^2$) was about three times that of the element of Comparative Example 1.

Even in the case of elements using other compounds of the present invention, an EL element having high durability can be produced.

According to the present invention, a light-emitting element with high efficiency and excellent durability can be provided.

The entire disclosure of each and every foreign patent application from which the benefit of foreign priority has been claimed in the present application is incorporated herein by reference, as if fully set forth.

What is claimed is:

1. An organic electroluminescent element comprising:
   a pair of electrodes; and
   at least one organic compound layer between the pair of electrodes, said at least one organic compound layer comprising a light-emitting layer,
   wherein the light-emitting layer comprises
   a light-emitting material; and
   a host material that emits light in a quantity of 5% or less based on the total light emission of the entire element, wherein the host material comprises at least one complex represented by formula (1):

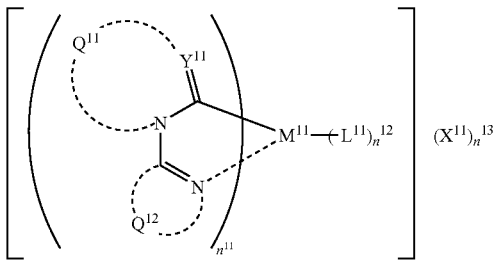

(1)

wherein $M^{11}$ represents a hexacoordinate transition metal ion, $Y^{11}$ represents a nitrogen atom or a substituted or unsubstituted carbon atom, $L^{11}$ represents a ligand, $Q^{11}$ and $Q^{12}$ each represents an atomic group for forming a nitrogen-containing heterocyclic ring, $n^{11}$ represents an integer of 1 to 3, $n^{12}$ represents an integer of 0 to 4, $X^{11}$ represents a counter ion, and $n^{13}$ represents an integer of 0 to 3.

2. The organic electroluminescent element as claimed in claim 1, wherein the complex represented by formula (1) is a complex represented by formula (2):

(2)

wherein $M^{21}$ represents a hexacoordinate transition metal ion, $Y^{21}$ to $Y^{27}$ each represents a nitrogen atom or a substituted or unsubstituted carbon atom, $L^{21}$ represents a ligand, $n^{21}$ represents an integer of 1 to 3, and $n^{22}$ represents an integer of 0 to 4.

3. The organic electroluminescent element as claimed in claim 2,
wherein $M^{21}$ is iridium;
$Y^{24}$ to $Y^{27}$ each represents a substituted or unsubstituted carbon atom;
$Y^{21}$ is unsubstituted carbon atom;
$Y^{22}$ is a substituted carbon atom;
$Y^{23}$ is nitrogen atom;
$n^{21}$ is an integer of 2 or 3;
$n^{22}$ is an integer of 0 or 1; and
$L^{21}$ is a bidentate nitrogen-containing heterocyclic ligand or diketone ligand.

4. The organic electroluminescent element as claimed in claim 2,
wherein $M^{21}$ is iridium;
$Y^{24}$ to $Y^{27}$ each represents a substituted or unsubstituted carbon atom;
$Y^{21}$ is unsubstituted carbon atom;
$Y^{22}$ is a substituted carbon atom;
$Y^{23}$ is nitrogen atom;
$n^{21}$ is an integer of 3; and
$n^{22}$ is an integer of 0.

5. The organic electroluminescent element as claimed in claim 1, wherein the hexacoordinate transition metal ion is a trivalent iridium ion, a trivalent rhodium ion or a monovalent rhenium ion.

6. The organic electroluminescent element as claimed in claim 1, wherein the amount of the complex represented by formula (1) in the light-emitting layer is from 70 mass % to 99.9 mass % of the total mass of the light-emitting layer.

7. The organic electroluminescent element as claimed in claim 6, wherein the amount of the complex represented by formula (1) in the light-emitting layer is from 80 mass % to 99.9 mass % of the total mass of the light-emitting layer.

* * * * *